US010727862B1

(12) United States Patent
Shamee et al.

(10) Patent No.: US 10,727,862 B1
(45) Date of Patent: Jul. 28, 2020

(54) PHOTONIC MONOBIT DIFFERENTIAL ANALOG-TO-DIGITAL CONVERTER

(71) Applicant: Raytheon Company, Waltham, MA (US)

(72) Inventors: Bishara Shamee, Playa Del Rey, CA (US); Steven R. Wilkinson, Stevenson Ranch, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/359,229

(22) Filed: Mar. 20, 2019

(51) Int. Cl.
| | |
|---|---|
| *H03M 1/00* | (2006.01) |
| *H03M 3/00* | (2006.01) |
| *G02F 7/00* | (2006.01) |
| *H03M 1/36* | (2006.01) |

(52) U.S. Cl.
CPC .............. *H03M 3/468* (2013.01); *G02F 7/00* (2013.01); *H03M 1/001* (2013.01); *H03M 1/361* (2013.01)

(58) Field of Classification Search
CPC ...... H03M 1/56; H03M 13/41; H03M 1/1245; H03M 3/458; H03M 1/12; H03M 7/30; H03M 13/112; H03M 13/1137; H03M 13/616; H03M 13/6577; H03M 1/123; H03M 1/468; H03M 3/358; H03M 3/402; H03M 3/502; H03M 7/3026; H03M 7/3033; H03M 13/116; H04B 1/525; H04B 1/10; H04B 1/0475; H04B 1/005; H04B 1/1027; H04B 1/62; H04B 10/614; H04B 10/67; H04B 10/505; H04B 2210/006;

(Continued)

(56) References Cited

U.S. PATENT DOCUMENTS

| | | |
|---|---|---|
| 5,444,447 A | 8/1995 | Wingender |
| 5,598,288 A | 1/1997 | Collar |

(Continued)

FOREIGN PATENT DOCUMENTS

EP 2909712 A2 8/2015

OTHER PUBLICATIONS

"U.S. Appl. No. 16/359,234, Non Final Office Action dated Oct. 1, 2019", 12 pgs.

(Continued)

*Primary Examiner* — Linh V Nguyen
(74) *Attorney, Agent, or Firm* — Schwegman Lundberg & Woessner, P.A.

(57) ABSTRACT

A photonic monobit analog-to-digital converter (ADC) includes an incoherent optical source configured to generate an optical noise signal, an optical modulator, at least one coupler, a photodetector, a limiter, and a DSP. The optical modulator is configured to modulate an input optical signal using an analog input electrical signal to generate an optical modulated signal. The coupler is configured to couple the optical modulated signal with the optical noise signal to generate at least one coupled signal. The photodetector is configured to generate a phase difference between the optical modulated signal and the optical noise signal using the at least one coupled signal. The limiter is configured to generate a decision signal based on the phase difference, and the DSP is configured to output a digital signal representative of the analog input electrical signal based on the decision signal.

20 Claims, 7 Drawing Sheets

(58) Field of Classification Search
CPC .................................................. H04B 10/2504;
H04B 10/2507; H04B 10/60; H04B
10/61; H04B 10/613
USPC ........................................................ 341/137
See application file for complete search history.

(56) References Cited

U.S. PATENT DOCUMENTS

| | | | |
|---|---|---|---|
| 6,002,480 A * | 12/1999 | Izatt ...................... | G01J 3/4412 |
| | | | 356/479 |
| 6,448,921 B1 | 9/2002 | Tsui et al. | |
| 6,476,949 B1 * | 11/2002 | Loh ....................... | G02B 6/2932 |
| | | | 398/158 |
| 6,704,511 B1 | 3/2004 | Kerfoot, III et al. | |
| 7,253,755 B1 * | 8/2007 | Fette ..................... | H03M 1/185 |
| | | | 341/118 |
| 7,406,304 B2 | 7/2008 | Busson et al. | |
| 7,423,564 B2 * | 9/2008 | Kitayama ............. | G02F 1/3519 |
| | | | 341/137 |
| 7,973,688 B2 * | 7/2011 | Huang ................... | G02F 7/00 |
| | | | 341/118 |
| 9,608,653 B2 * | 3/2017 | Le Dortz ............. | H03M 1/0614 |
| 9,843,398 B1 | 12/2017 | Zanoni et al. | |
| 10,038,498 B1 | 7/2018 | Fan et al. | |
| 10,298,256 B1 | 5/2019 | Robinson et al. | |
| 2002/0164125 A1 * | 11/2002 | Berger .................. | H04B 10/503 |
| | | | 385/39 |
| 2003/0007215 A1 * | 1/2003 | Snawerdt ............. | H04B 10/071 |
| | | | 398/139 |
| 2003/0115028 A1 | 6/2003 | Summerfield et al. | |
| 2003/0198424 A1 * | 10/2003 | Bennett ................. | G01C 19/721 |
| | | | 385/12 |
| 2004/0028414 A1 | 2/2004 | Quesenberry et al. | |
| 2004/0218932 A1 * | 11/2004 | Epworth ............... | H04B 10/2513 |
| | | | 398/202 |
| 2006/0182209 A1 | 8/2006 | Coyne et al. | |
| 2006/0262664 A1 | 11/2006 | Imoto | |
| 2008/0031633 A1 | 2/2008 | Hoshida et al. | |
| 2008/0205886 A1 | 8/2008 | Anderson et al. | |
| 2009/0033424 A1 | 2/2009 | Nauta | |
| 2009/0136240 A1 | 5/2009 | Malouin et al. | |
| 2009/0317075 A1 * | 12/2009 | Mandai .................. | H04B 10/60 |
| | | | 398/25 |
| 2011/0052216 A1 | 3/2011 | Jiang et al. | |
| 2011/0123192 A1 | 5/2011 | Rosenthal et al. | |
| 2011/0150503 A1 * | 6/2011 | Winzer .................. | H04B 10/60 |
| | | | 398/202 |
| 2012/0213531 A1 * | 8/2012 | Nazarathy ............. | H03M 1/145 |
| | | | 398/202 |
| 2013/0216239 A1 | 8/2013 | Zhang et al. | |
| 2015/0154007 A1 * | 6/2015 | Sussman ................ | G06F 7/588 |
| | | | 708/250 |
| 2016/0173202 A1 | 6/2016 | Kelly | |
| 2017/0237500 A1 | 8/2017 | Nishimoto | |
| 2018/0006732 A1 * | 1/2018 | Pang .................... | H04B 10/691 |
| 2018/0074348 A1 | 3/2018 | Fujita et al. | |
| 2018/0198533 A1 | 7/2018 | Zhou et al. | |
| 2018/0269964 A1 | 9/2018 | Mertz et al. | |

OTHER PUBLICATIONS

Aziz, P. M., et al., "An Overview of Sigma-Delta Converters", IEEE Signal Processing Magazine, (Jan. 1996), 61-84.

Cvetkovic, Zoran, et al., "Single-Bit Oversampled A/D Conversion With Exponential Accuracy in the Bit Rate", IEEE Transactions on Information Theory, vol. 53, No. 11, (2007), 3979-3989.

Dabeer, Onkar, et al., "Signal Parameter Estimation Using 1-Bit Dithered Quantization", IEEE Transactions on Information Theory, vol. 52, No. 12,, (Dec. 2006), 5389-5405.

Qi, Bing, et al., "High-speed quantum random number generation by measuring phase noise of a single-mode laser", Optics Letters / vol. 35, No. 3, (Feb. 2010), 312-314.

Roberts, Lawrence, "Picture Coding Using Pseudo-Random Noise", IRE Transactions on Information Theory, (1962), 145-154.

Rodenbeck, Christopher, et al., "Monobit Subsampler for Digital Downconversion in Pulse-Doppler Radar Applications", IEEE Transactions on Microwave Theory and Techniques, vol. 57, No. 5, (2009), 1036-1043.

Sinem, Ergen, et al., "Effect of Analog-to Digital Converter in Distributed Sampling for Sensor Networks", (2005), 8 pgs.

Valley, George C, "Photonic analog-to-digital converters", Optics Express , vol. 15, No. 5, [Online] Retrieved from the Internet: <https://pdfs.semanticscholar.org/a868/e2d948b01cef975868088cf23flf0c2041f2.pdf>, (2007), 28 pgs.

Wang, Zhiyong, et al., "Monobit Digital Receivers for QPSK: Design, Performance and Impact of IQ Imbalances", arXiv:1202.6141v3 [cs.IT], (2013), 29 pgs.

Wannamaker, Rob, "A theory of Non-Subtractive Dither", IEEE Transactions on Signal Processing 48(2):499-516, (2000), 56 pgs.

"U.S. Appl. No. 16/359,234, Response filed Jan. 2, 2020 to Non Final Office Action dated Oct. 1, 2019", 13 pgs.

"U.S. Appl. No. 16/359,263, Non Final Office Action dated Feb. 18, 2020", 22 pgs.

"White Noise", Wikipedia,, (2017).

Deshpande, "Electron Devices and Circuits: Principles and Applications", Tata McGraw-Hill Education, (2008), 125-126.

Kakande, "QPSK Phase and Amplitude Regeneration at 56 Gbaud in a Novel Idler-Free Non-Degenerate Phase Sensitive Amplifier", OSA, (2011).

Kaminov, "Optical Fiber Telecommunications vol. VIB: Systems and Network", Academic Press, (2013), 932-934.

"International Application Serial No. PCT/US2020/012547, International Search Report dated May 4, 2020", 5 pgs.

"International Application Serial No. PST/US2020/012547, Written Opinion dated May 4, 2020", 7 pgs.

Ajmal, T, et al., "Design of a 10Gbps Optical Burst mode DPSK Receiver for Data and Clock Recovery", EC0C2008, ECOC, Brussels, ECOC, Brussels EXPO, Belgium, (Sep. 21, 2008). 2 pgs.

Malouin, Christian, et al., "Differential Phase-Shift Keying Receiver Design Applied to Strong Optical Filtering", Journal of Lightwave Technology, IEEE, USA, vol. 25, No. 11, (Nov. 1, 2007), 3536-3542.

Yamada, Yoshiaki, et al., "High-Level Fluctuation Tolerant Optical Receiver for Optical Packet Switch and WDM Cross-Connect", Journal of Lightwave Technology, IEEE, USA, vol. 16, No. 12, (Dec. 1, 1998), 2220-2227.

* cited by examiner

US 10,727,862 B1

PHOTONIC MONOBIT DIFFERENTIAL ANALOG-TO-DIGITAL CONVERTER

TECHNICAL FIELD OF THE DISCLOSURE

The present disclosure relates to analog-to-digital converters (ADCs). More specifically, the present disclosure relates to photonic monobit ADCs, such as photonic monobit differential ADCs.

BACKGROUND OF THE DISCLOSURE

As communication systems evolve over time, digital data rates tend to increase. As a result, there is an ongoing effort to increase the speed and accuracy of analog-to-digital conversion to support the increase in communication rates.

High bandwidth and high spur-free dynamic range analog-to-digital conversion is a common desire across multiple domains but is difficult to achieve. With the advent of photonics, the analog-to-digital conversion can be improved beyond the electronic conversion by harvesting the photonics bandwidth and balancing the functional partition between electronics and photonics.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting the scope of the invention in any manner.

DETAILED DESCRIPTION

The following description and the drawings sufficiently illustrate aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

Techniques disclosed herein can be used to realize a photonic ADC with high spur free dynamic range (SFDR) based on a monobit concept, based on dithering an input signal with uniform noise. More specifically, a photonic monobit ADC can include an optical incoherent noise source to phase dither an optical waveform that is representative of a radio frequency (RF) waveform of interest. By mapping an incoming RF waveform into an optical phase and combining with an optical high bandwidth incoherent noise source, the photonic interferometry can be utilized to dither and detect the phase difference using wideband detectors (e.g., dither the modulated phase with an incoherent source). The phase difference is then detected and compared for signal processing and recovery. In this regard, by using photonic capabilities in monobit ADC technology, lower power consumption and better performance at the higher sampling rates can be achieved.

Figure 1:
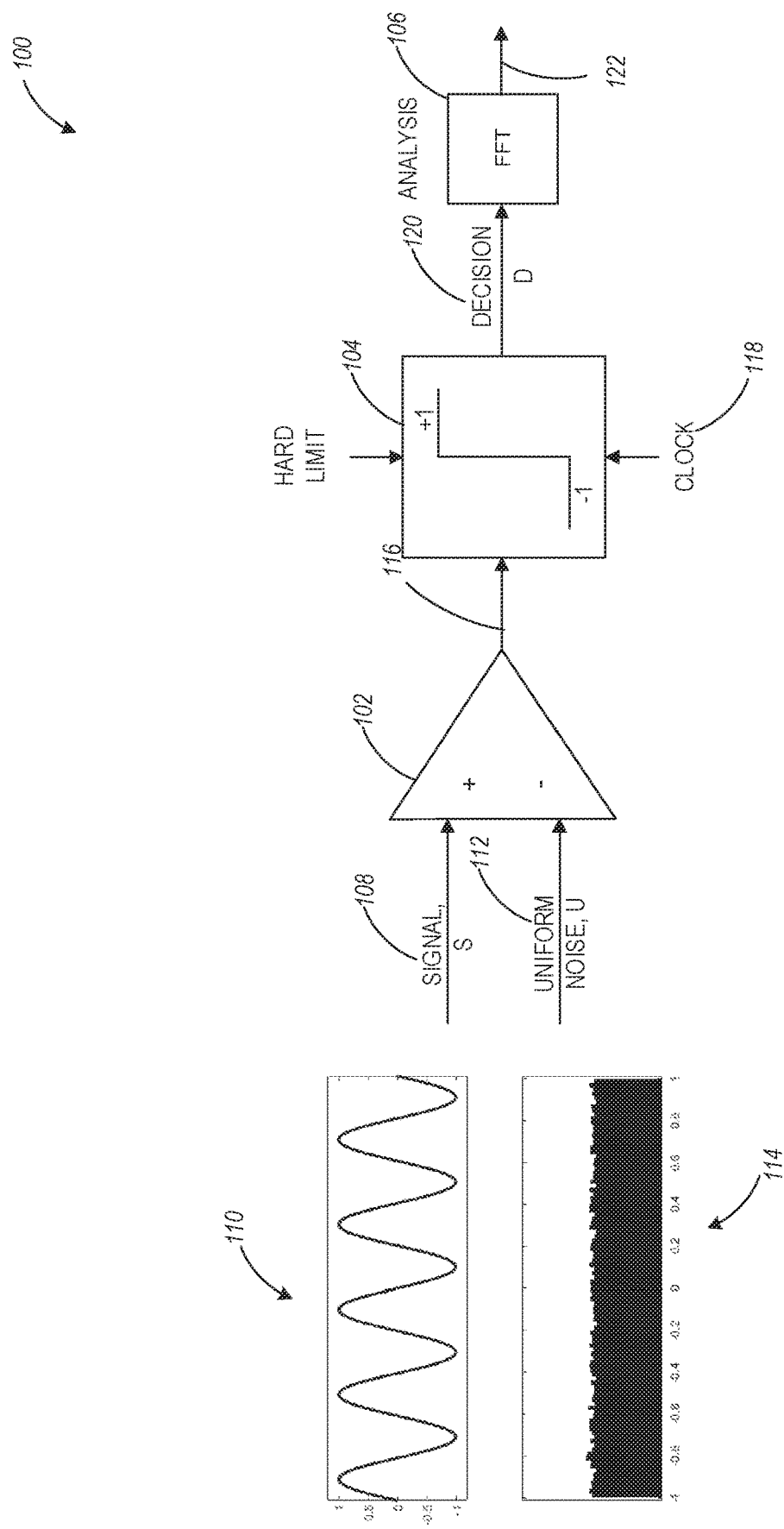
FIG. 1 illustrates a conceptual block diagram of a monobit ADC, in accordance with some aspects.

FIG. 1 illustrates a conceptual block diagram of a monobit ADC 100, in accordance with some aspects. Electronic monobit ADCs convert an analog signal to its digital representation based on dithering an input signal with uniform noise. Referring to FIG. 1, the monobit ADC 100 can include a comparator 102 and a limiter 104. The comparator 102 is configured to receive an analog input signal (S) 108 and a uniform noise signal (U) 112. The analog input signal 108 can have a signal profile as illustrated in graph 110, and the uniform noise signal 112 can have a noise distribution as illustrated in graph 114.

The comparator 102 compares the analog input signal 108 with the uniform noise signal 112 to generate a comparison result 116. The limiter 104 is configured to receive a clock signal 118 and the comparison result 116, and hard limit the comparison result to +1 (if the signal is greater than the noise) or −1 (if the noise is greater than the signal). The limiter 104 outputs a decision signal (D) 120, with the expected value (or average) of the limiter output signal D 120 being a digital signal representation 122 of the analog input signal 108, after processing with a filter (e.g., in a digital signal processing block or a Fourier frequency transform (FFT) block such as FFT block 106).

One of the main limitations of analog-to-digital conversion at higher rates is the introduced spurs of undesired tones resulting from realization imperfections. A significant advantage of the monobit ADC architecture is the high SFDR resulting from the dithering (or applying uniform noise to) the input signal.

Figure 2:
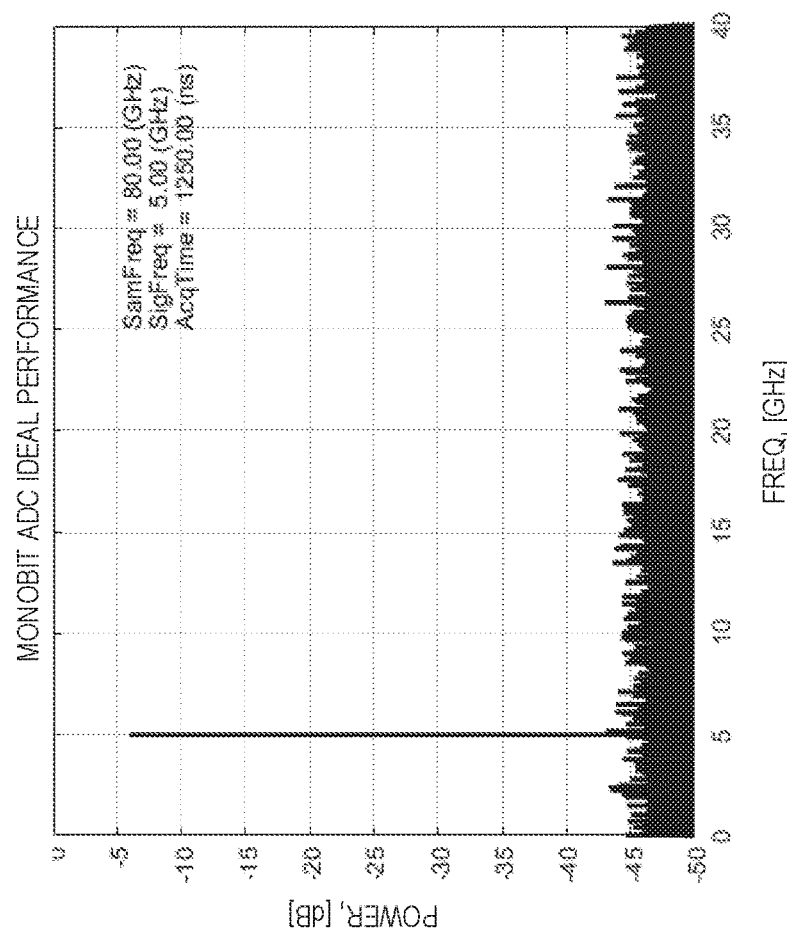
FIG. 2 is a graphical representation illustrating a frequency Fourier transform (FFT) magnitude of a tone based on the monobit ADC of FIG. 1.

FIG. 2 is a graphical representation 200 illustrating a frequency Fourier transform (HT) magnitude of a tone based on the monobit ADC 100 of FIG. 1. FIG. 2 is illustrative of the spur free range of monobit conversion. More specifically, FIG. 2 illustrates the frequency and power profile of a tone at 5 GHz that is sampled at 80 GHz with an acquisition time of 1.25 µs. The spurs appear relatively at the same power level as illustrated by the FFT of the limiter output.

Some techniques for implementing electronic monobit conversion can rely on generating digital pseudo-random noise, which can consume a large portion of the ASIC power and can be a limiting factor is the sampling rates increase. One of the advantages of photonics is its bandwidth and relative efficiency. In this regard, techniques disclosed herein can be used to realize a photonic monobit ADC, based on a modulator that modulates the electrical signal onto an optical carrier to be compared with an incoherent wide bandwidth noise source, as discussed herein below.

Figure 3:
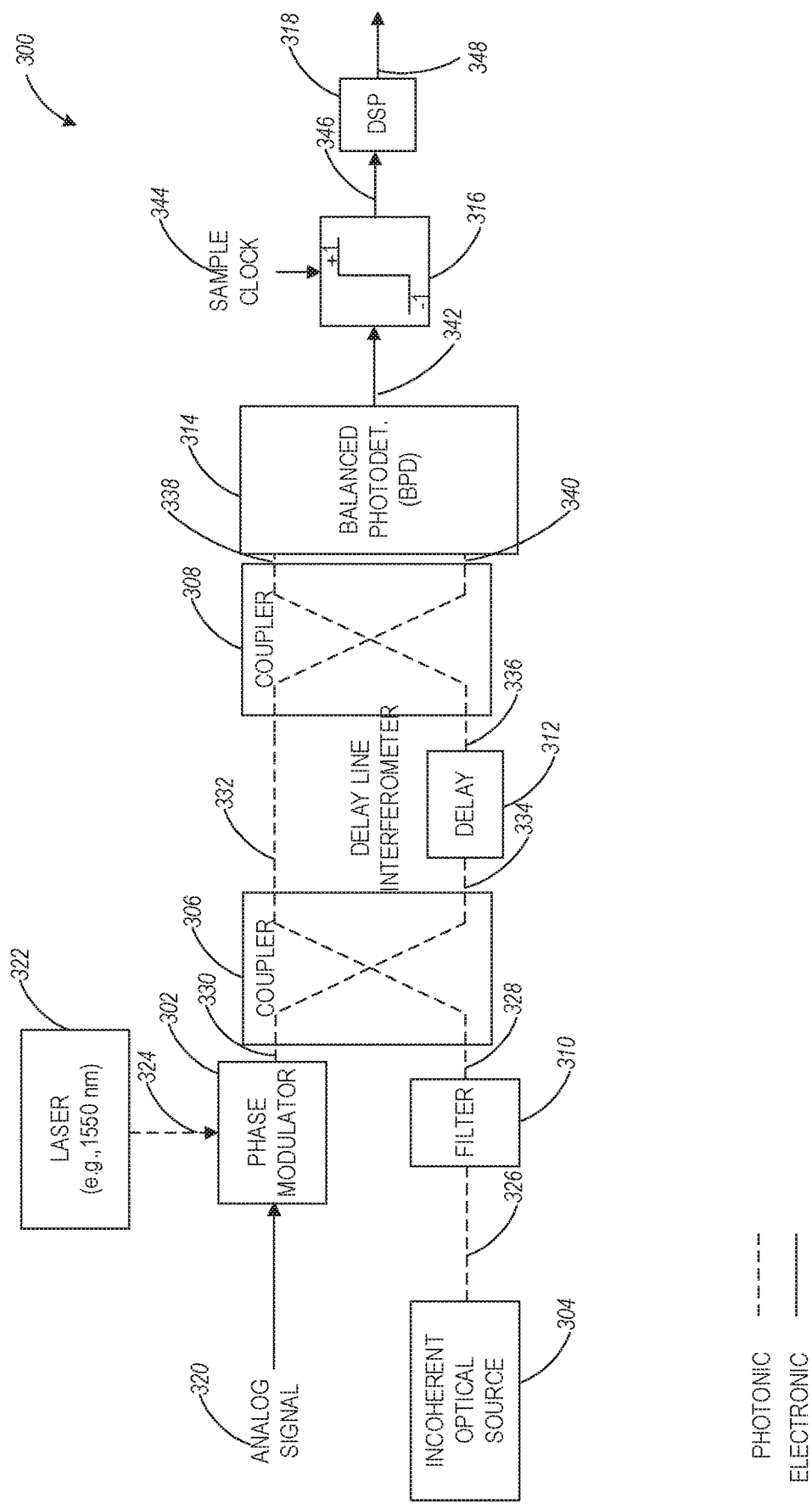
FIG. 3 is a block diagram of a photonic monobit ADC, in accordance with some aspects.

FIG. 3 is a block diagram of a photonic monobit ADC 300, in accordance with some aspects. Referring to FIG. 3, the photonic monobit ADC 300 can include a phase modulator 302, an incoherent optical source 304, a first coupler 306, a second coupler 308, a filter 310, a delay circuit 312, a balanced photodetector (BPD) 314, a limiter 316, and a DSP 318.

Figure 4:
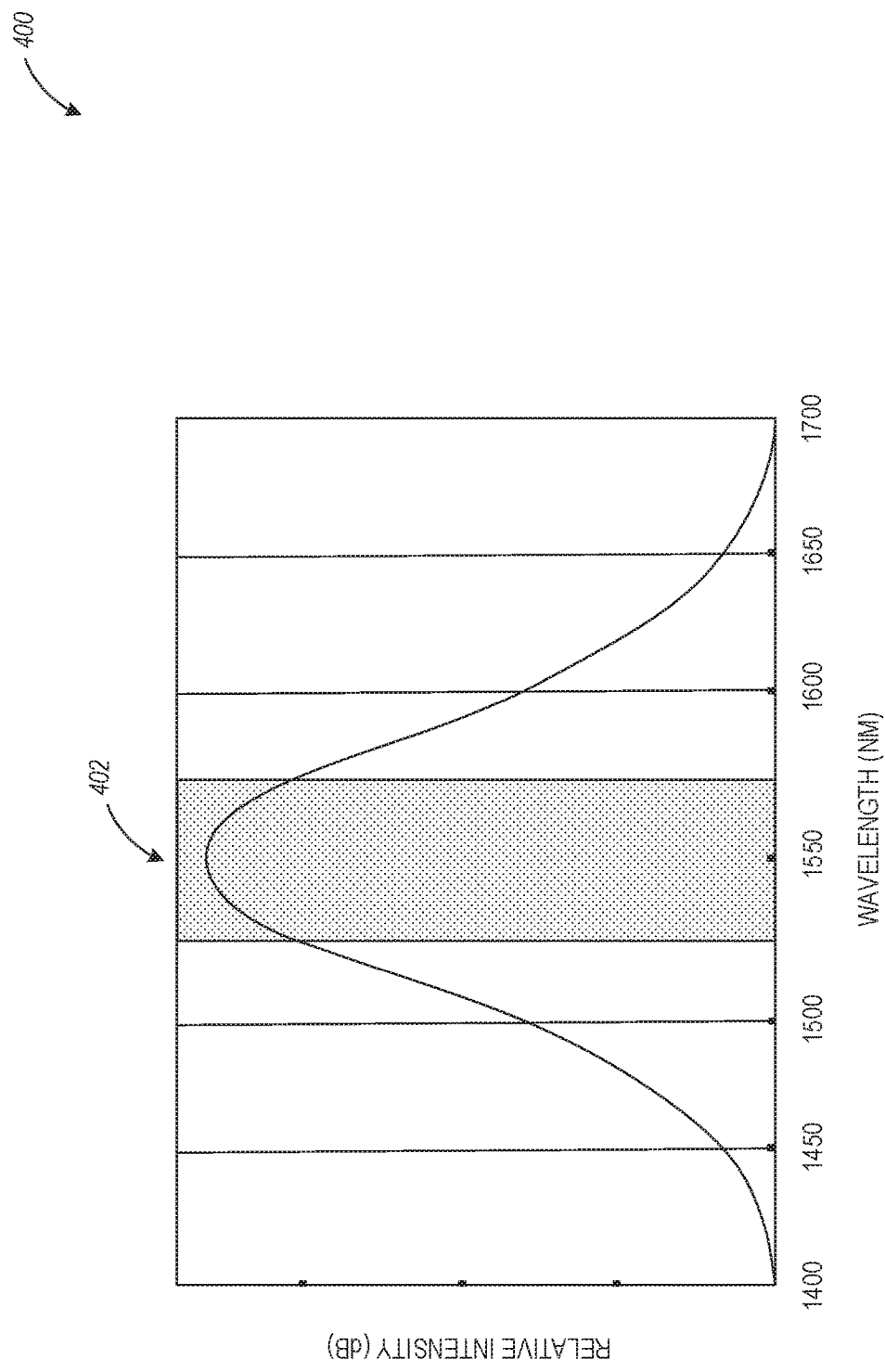
FIG. 4 is a graphical spectral representation of a noise signal from an incoherent optical source which can be used in connection with the ADC of FIG. 3.

The optical source 304 can be an incoherent signal source generating an optical or photonic noise signal 326, where the signal phases are random and uniformly distributed over the range of the signal, from sample to sample, with low correlation existing between any two samples. FIG. 4 is a graphical spectral representation 400 of a noise signal (e.g., 326) from the incoherent optical source 304 used in connection with the photonic monobit ADC 300. In some aspects, the optical source 304 can be an incoherent white light emitting diode (LED) source with a high bandwidth, such as a bandwidth exceeding 1 THz, an amplified spontaneous emissions (ASE) light source, or another type of optical noise source. As illustrated in FIG. 4, the noise signal 326 can be filtered so that a limited slice (e.g., 402) can be selected for dithering with another optical signal within the photonic monobit ADC 300.

The filter 310 can be configured to filter the optical noise signal 326 generated by the incoherent optical source 304, to obtain an optical filtered noise signal 328. In some aspects, the filter 310 can be a 1 nm filter that can be configured to generate a 12.5 GHz optical noise signal slice with a random phase samples. In some aspects, the filtered noise signal 328 can be centered at 1550 nm wavelength as shown in FIG. 4.

The phase modulator 302 may comprise suitable circuitry, logic, interfaces and/or code and is configured to receive an input optical signal 324 and an analog input electrical signal 320, to generate an optical modulated signal 330. The input optical signal 324 can be a laser signal generated by laser 322. In some aspects, the laser 322 can be a 1550 nm laser or another wavelength laser. The phase modulator 302 is configured to phase modulate the analog input signal 320 onto the optical signal 324 to generate the optical modulated signal 330 (i.e., the phase of the optical modulated signal 330 corresponds to the signal amplitude of the analog input signal 320).

The first coupler 306 is configured to couple the optical modulated signal 330 and the filtered noise signal 328 from the incoherent optical source 304, to generate first and second optical coupled signals 332 and 334. In some aspects, the lower arm coupled signal 334 can be offset (e.g., by 90°) from the coupled signal 332 in the upper arm.

The delay circuit 312 is configured to delay the lower arm coupled signal 334 and generate an optical delayed coupled signal 336. In some aspects, the delay circuit 312 can be a programmable delay circuit. In some aspects, the delay circuit 312 can provide a 1-bit time delay in order to assist the BPD 314 to obtain phase difference.

The second coupler 308 is configured to couple the upper arm coupled signal 332 and the lower arm delayed coupled signal 336 to generate third and fourth optical coupled signals 338 and 340. By using the second coupler 308, DC-coupling between the coupled signals 336 and 332 can be removed.

The BPD 314 may comprise suitable circuitry, logic, interfaces and/or code and is configured to generate an electrical output signal 342 indicative of a phase difference between the optical modulated signal 330 and the filtered noise signal 328. The limiter 316 is configured to receive the output signal 342 and an electrical clock signal 344, and generate a decision signal 346 corresponding to the analog input signal 320 based on the output signal 342 from the BPD 314. The decision signal 346 can be further processed (e.g., by filtering, signal reconstruction, and/or other signal processing) performed by the DSP module 318, to generate an output digital signal 348.

In some aspects, techniques disclosed herein can be used to implement a Σ-Δ ADC as the difference between a current and previous signal sample can be computed based on the delay provided by the delay circuit 312.

In some aspects, signal phase modulation can introduce harmonics due to the phase modulation which can be expanded using the Jacobi-Anger Bessel expansion.

Figure 5:
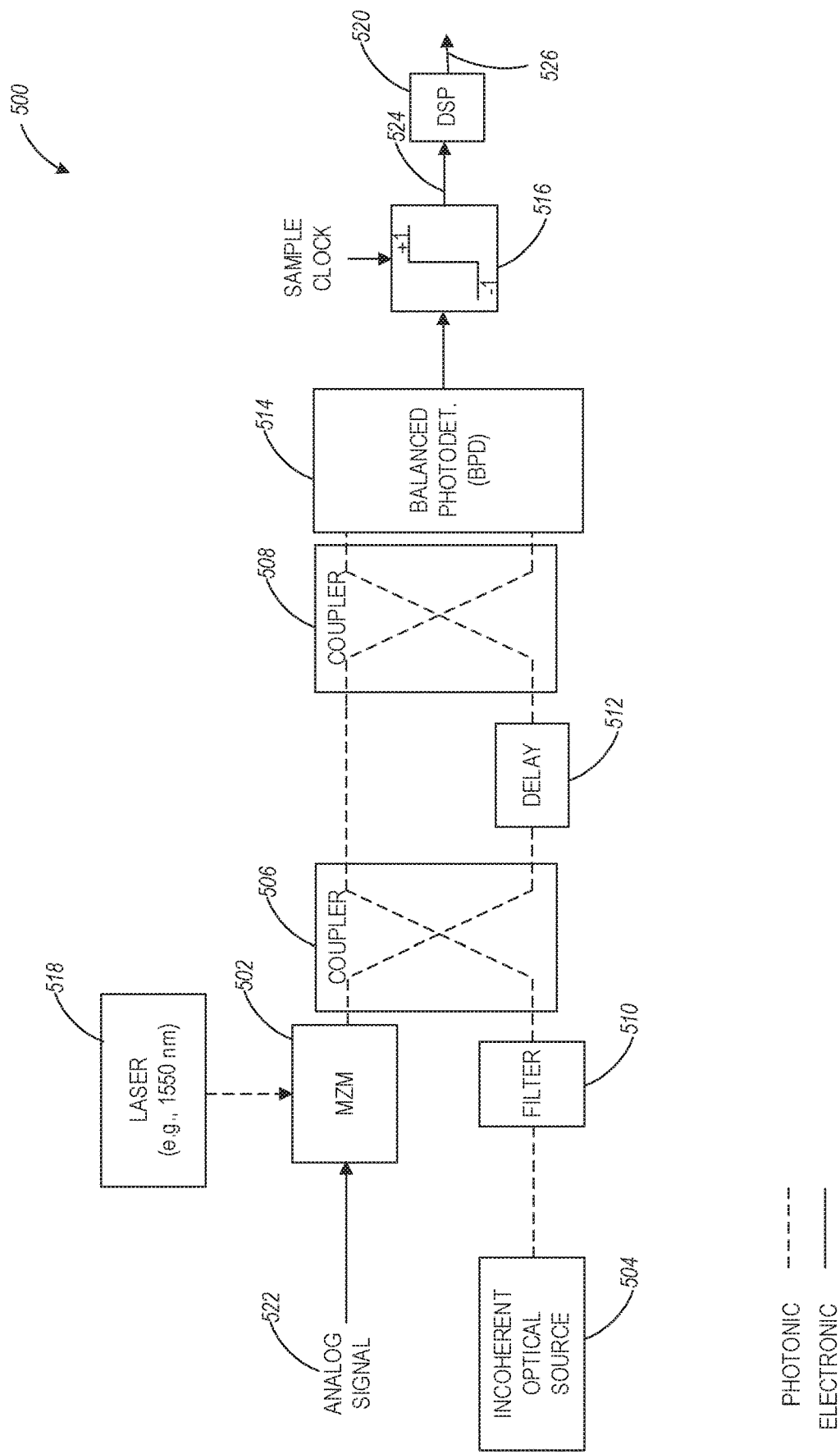
FIG. 5 is a block diagram of a photonic monobit ADC using a Mach Zehnder modulator, in accordance with some aspects.

FIG. 5 is a block diagram of a photonic monobit ADC 500 using a Mach Zehnder modulator, in accordance with some aspects. Referring to FIG. 5, the photonic monobit ADC 500 can include an MZM 502, and incoherent optical source 504, first and second couplers 506 and 508, an optical signal filter 510, a delay circuit 512, a BPI) 514, a limiter 516, and a DSP 520. The MZM 502 is configured to receive the input analog signal 522 and an optical signal generated by the laser light source 518.

The functionalities of the couplers 506 and 508, the optical signal filter 510, the delay circuit 512, the BPD 514, the limiter 516, and the DSP 520 can be similar to the corresponding functionalities of the couplers 306 and 308, the optical signal filter 310, the delay circuit 312, the BPD 314, the limiter 316, and the DSP 318 of FIG. 3. The decision signal 524, which corresponds to the analog input signal 522, can be further processed by the DSP module 520 (e.g., by filtering and signal reconstruction) to generate the digital output signal 526.

Figure 6:
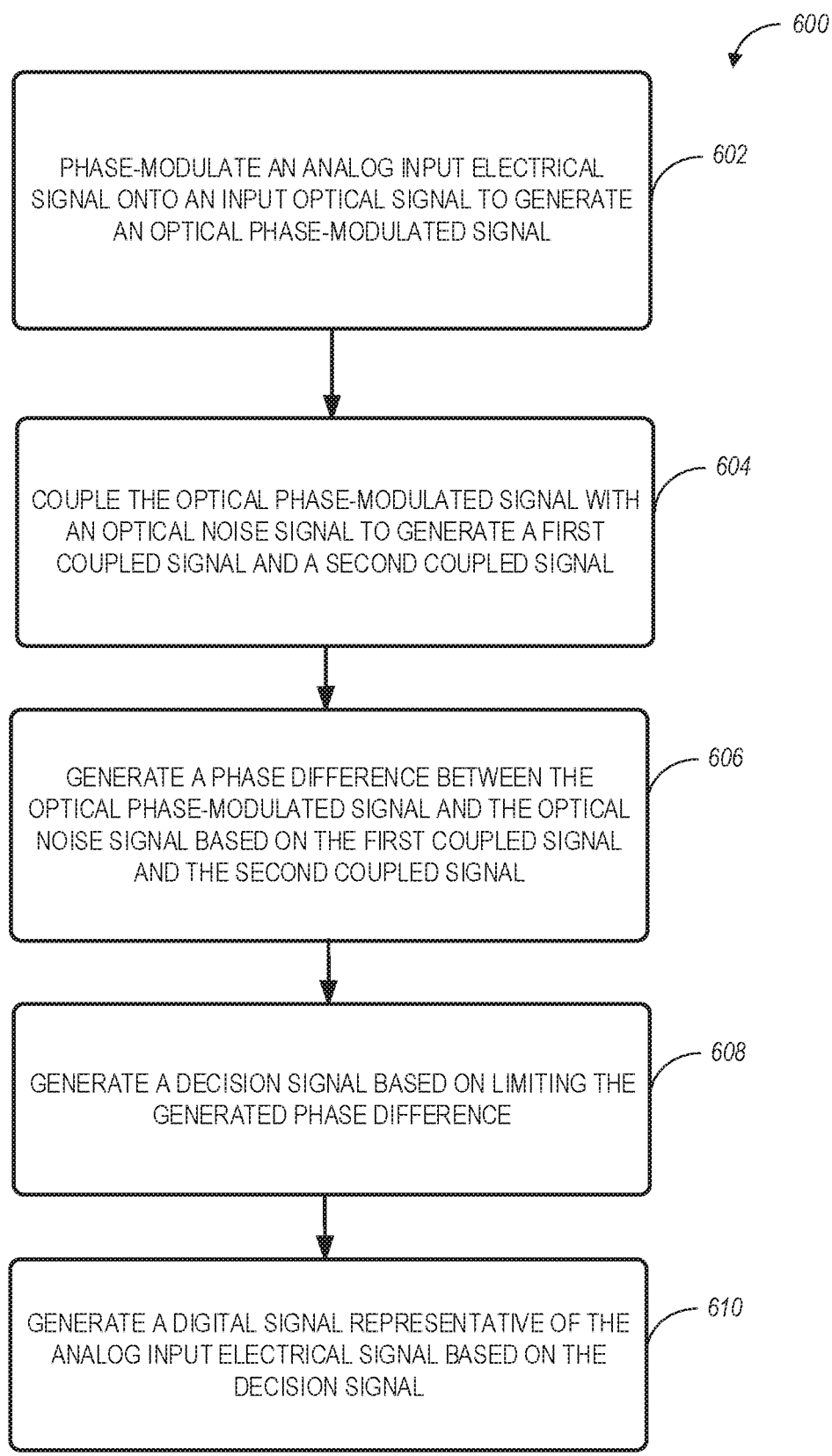
FIG. 6 illustrates generally a flowchart of example functional which can be performed in connection with analog-to-digital conversion, in accordance with some aspects.

FIG. 6 illustrates generally a flowchart of example functionalities which can be performed in connection with analog-to-digital conversion, in accordance with some aspects. Referring to FIG. 6, the method 600 includes operations 602, 604, 606, 608, and 610. By way of example and not limitation, the method 600 is described as being performed by one or more of the components of the photonic monobit ADC 300 of FIG. 3. At operation 602, an analog input electrical signal is phase-modulated onto an input optical signal to generate an optical phase-modulated signal. For example, the input analog signal 322 is phase-modulated onto the input optical signal 324 by the modulator 302 to generate the optical phase-modulated signal 330.

At operation 604, the optical phase-modulated signal is coupled with an optical noise signal to generate a first coupled signal and a second coupled signal. For example, coupler 306 can couple the optical phase-modulated signal 330 and the filtered optical noise signal 328 to generate a first coupled signal 332 and a second coupled signal 334.

At operation 606, a phase difference is generated between the optical phase-modulated signal and the optical noise signal based on the first coupled signal and the second coupled signal. For example, the BPI) 314 can generate the output signal 342 indicative of the phase difference between the optical phase-modulated signal 330 and the filtered optical noise signal 328. Prior to communicating the coupled signals generated by first coupler 306, the lower arm of the coupled signal outputs, i.e., the second coupled signal 334, can be delayed by delay circuit 312 and additional coupling can be performed by a second coupler 308 to remove DC bias.

At operation 608, a decision signal representative of the analog input electrical signal is generated based on the determined phase difference. For example, the limiter 316 generates the decision signal 346 based on the output signal 342 indicative of the phase difference between the optical phase-modulated signal 330 and the filtered optical noise signal 328. At operation 610, a digital signal representative of the analog input electrical signal is generated based on the decision signal. For example, the DSP 318 generates the output digital signal 348 representative of the input analog signal 320 based on the decision signal 346 generated by the limiter 316.

In some aspects, due to the fact that the phase modulator in the incoherent optical source output signals are photonic, signal parallelization can be used within a photonic monobit ADC by splitting the optical signals, while maintaining the uniformity of the signal and allowing use of multiple signal samples. In this regard, signal averages can be obtained quicker and more accurately within a photonic monobit ADC. An example photonic monobit ADC with photonic signal splitting is illustrated in FIG. 7.

Figure 7:
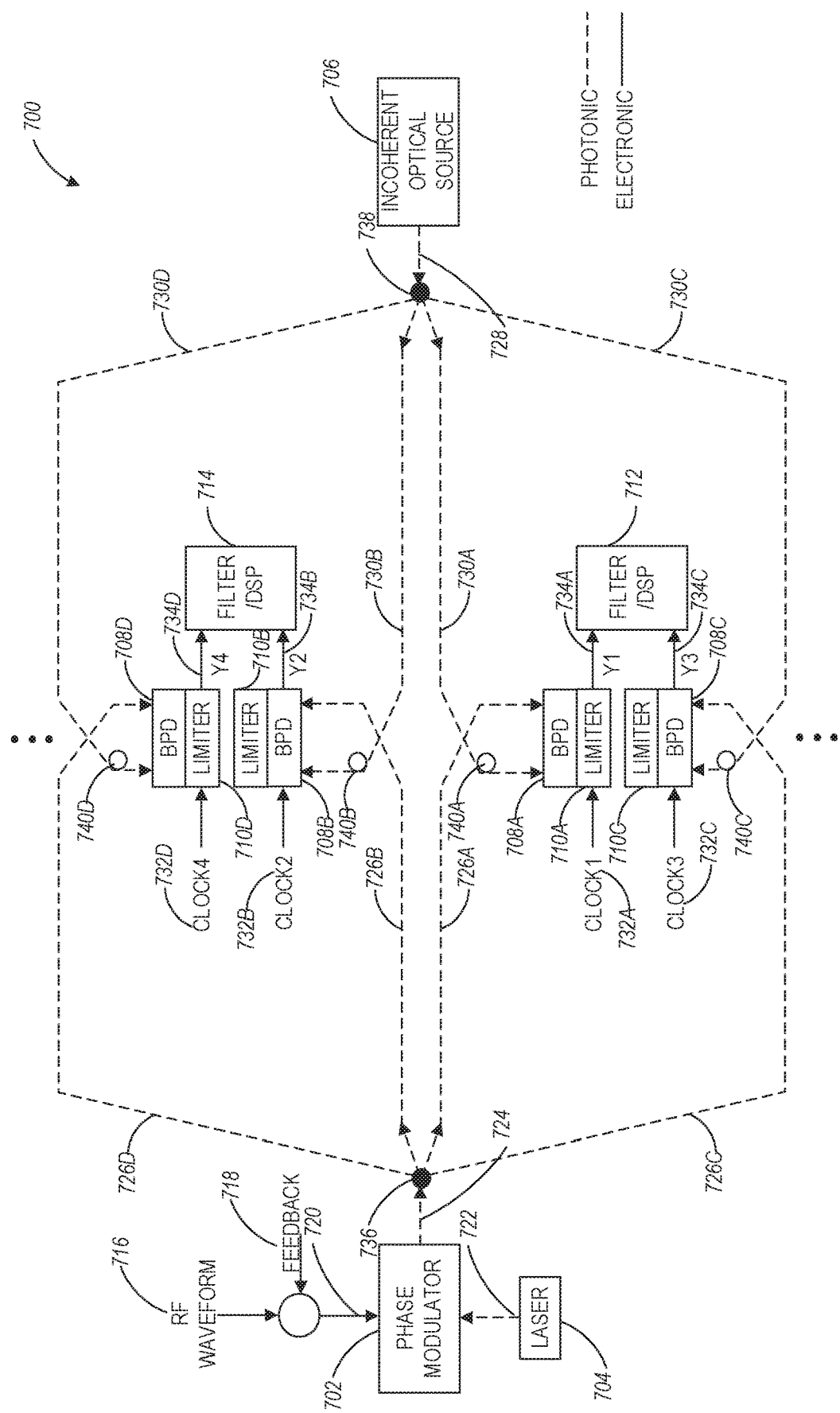
FIG. 7 is a block diagram of a photonic monobit ADC using signal splitting, in accordance with some aspects.

FIG. 7 is a block diagram of a photonic monobit ADC 700 using signal splitting, in accordance with some aspects. Referring to FIG. 7, the photonic monobit ADC 700 can include a phase modulator 702, a laser light source 704, an incoherent optical source 706, a plurality of BPDs (e.g., 708A, 708B, 708C, and 708D), a plurality of limiters (e.g., 710A, 710B, 710C, and 710D), DSP circuits 712 and 714, photonic signal splitters 736 and 738, and a plurality of delay circuits e.g., 740A, 740B, 740C, and 740D). The functionality of the circuits illustrated in FIG. 7 in connection with photonic monobit ADC 700 can be similar to corresponding functionalities of the same circuits illustrated in connection with the photonic monobit ADC 300 in FIG. 3.

In operation, an input analog signal 716 and an optical signal 722 generated by laser light source 704 can be communicated to the phase modulator 702. The phase modulator 702 can generate a modulated optical signal 724 which can be split by splitters 736 into modulated optical signals 726A, 726B, 726C, and 726D for processing by the corresponding BPDs 708A, 708B, 708C, and 708D. The incoherent optical source 706 can generate an optical noise signal 728 which can be split by splitters 738 into optical noise signals 730A, 730B, 730C, and 730D that are delayed by delay circuits 740A, 740B, 740C, and 740D prior to processing by the BPDs 708A, 708B, 708C, and 708D. The limiters 710A, 710B, 710C, and 710D can use corresponding clock signals 732A, 732B, 732C, and 732D together with the detected phase signal output from the BPDs 708A-708D, to generate digital signals 734A, 734B, 734C, and 734D corresponding to the input analog signal 716. The digital signals 734A, 734B, 734C, and 734D can be further processed by the DSP circuits 714 and 712.

Even though FIG. 7 illustrates a photonic monobit ADC 700 that includes splitters 736 and 738 splitting a modulated optical signal into four separate modulated optical signals for processing by four separate BPI)/limiter processing chains, the disclosure is not limited in this regard and the modulated optical signals 724 and 728 can be split into a different number of signals (e.g., a multiple of 4) for processing by a corresponding number of BPD/limiter/DSP processing chains.

In some aspects, the photonic monobit ADC 700 can implement processing functionalities. In this regard, the DSP circuits 712 and 714 can generate feedback 718 which can be combined with the input analog signal 716 prior to communication to the phase modulator 702 in connection with the Σ-Δ processing functionalities.

Although an aspect has been described with reference to specific example aspects, it will be evident that various modifications and changes may be made to these aspects without departing from the broader scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

Such aspects of the inventive subject matter may be referred to herein, individually or collectively, merely for convenience and without intending to voluntarily limit the scope of this application to any single aspect or inventive concept if more than one is in fact disclosed. Thus, although specific aspects have been illustrated and described herein, it should be appreciated that any arrangement calculated to achieve the same purpose may be substituted for the specific aspects shown. This disclosure is intended to cover any and all adaptations or variations of various aspects. Combinations of the above aspects, and other aspects not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed. Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus the following claims are hereby incorporated into the Detailed Description, with each claim standing on its own as a separate aspect.

What is claimed is:

1. A photonic monobit analog-to-digital converter, comprising:
   an optical source configured to generate an optical noise signal, the optical noise signal comprising random signal phases that are uniformly distributed over a pre-determined range of the optical noise signal;
   an optical modulator configured to modulate an analog input electrical signal onto an input optical signal to generate an optical modulated signal;
   a coupler configured to couple the optical modulated signal with the optical noise signal to generate at least one coupled signal, the at least one coupled signal having a spur free dynamic range (SFDR) based on the uniformly distributed random signal phases of the optical noise signal;
   a photodetector configured to generate a phase difference between the optical modulated signal and the optical noise signal using the at least one coupled signal;
   a limiter configured to output a decision signal based on the phase difference; and
   a digital signal processing (DSP) circuit configured to generate a digital signal representative of the analog input electrical signal based on the decision signal.

2. The photonic monobit analog-to-digital converter of claim 1, wherein the optical source is a white light emitting diode (LED) source or an amplified spontaneous emissions (ASE) light source with a bandwidth exceeding 1 THz.

3. The photonic monobit analog-to-digital converter of claim 2, further comprising:
   a filter configured to generate a filtered optical noise signal using the optical noise signal, wherein the generated phase difference is between the optical modulated signal and the filtered optical noise signal.

4. The photonic monobit analog-to-digital converter of claim 3, wherein the filtered optical noise signal comprises a bandwidth of 125 GHz or bandwidth in excess of 125 GHz.

5. The photonic monobit analog-to-digital converter of claim 1, wherein the coupler is configured to generate a first coupled signal and a second coupled signal based on the optical modulated signal and the optical noise signal, the second coupled signal being 90-degree phase shifted from the first coupled signal.

6. The photonic monobit analog-to-digital converter of claim 5, further comprising:
a tunable delay circuit configured to delay the second coupled signal to generate a delayed coupled signal.

7. The photonic monobit analog-to-digital converter of claim 6, further comprising:
a second coupler configured to couple the first coupled signal and the delayed coupled signal to generate a third coupled signal and a fourth coupled signal,
wherein the photodetector is configured to determine the phase difference between the phase of the optical modulated signal and the phase of the optical noise signal using the third coupled signal and the fourth coupled signal.

8. The photonic monobit analog-to-digital converter of claim 1, wherein the optical modulator is a phase modulator configured to phase modulate the analog input electrical signal onto the input optical signal to generate the optical modulated signal.

9. The photonic monobit analog-to-digital converter of claim 1, further comprising:
a laser light source configured to generate the input optical signal.

10. The photonic monobit analog-to-digital converter of claim 9, wherein the laser light source is a 1550 nm laser light source.

11. The photonic monobit analog-to-digital converter of claim 1, wherein the optical modulator is a Mach-Zehnder modulator.

12. A method for generating a digital signal representative of an analog input electrical signal, the method comprising:
phase-modulating an input optical signal using an analog input electrical signal to generate an optical phase-modulated signal;
coupling the optical phase-modulated signal with an optical noise signal to generate a first coupled signal and a second coupled signal, the optical noise signal comprising random signal phases that are uniformly distributed over a pre-determined range of the optical noise signal, and the first coupled signal having a spur free dynamic range (SFDR) based on the uniformly distributed random signal phases of the optical noise signal;
generating a phase difference between the optical phase-modulated signal and the optical noise signal based on the first coupled signal and the second coupled signal;
generating a decision signal based on limiting the generated phase difference; and
generating a digital signal representative of the analog input electrical signal based on the decision signal.

13. The method of claim 12, further comprising:
generating a filtered optical noise signal using the optical noise signal, wherein the generated phase difference is between the optical phase-modulated signal and the filtered optical noise signal.

14. The method of claim 12, further comprising:
delaying the second coupled signal to generate a delayed coupled signal.

15. The method of claim 14, further comprising:
coupling the first coupled signal and the delayed coupled signal to generate a third coupled signal and a fourth coupled signal.

16. The method of claim 15, further comprising:
generating the phase difference between the optical phase-modulated signal and the optical noise signal using the third coupled signal and the fourth coupled signal.

17. The method of claim 12, further comprising:
limiting the phase difference to generate a digital output; and
averaging the digital output to generate the digital signal representative of the analog input electrical signal.

18. A photonic monobit analog-to-digital converter, comprising:
an optical source configured to generate an optical noise signal, the optical noise signal comprising random signal phases that are uniformly distributed over a pre-determined range of the optical noise signal;
a filter configured to generate a filtered noise signal using the generated optical noise signal;
an optical phase modulator configured to modulate an input optical signal using an analog input electrical signal to generate an optical phase modulated signal;
a first coupler configured to couple the optical phase modulated signal with the filtered noise signal to generate a first coupled signal and a second coupled signal, the first and second coupled signals having a spur free dynamic range (SFDR) based on the uniformly distributed random signal phases of the optical noise signal;
a second coupler configured to couple the first coupled signal and a delayed version of the second coupled signal to generate a third coupled signal and a fourth coupled signal;
a photodetector configured to generate a phase difference between the optical phase modulated signal and the filtered noise signal based on the third coupled signal and the fourth coupled signal;
a limiter configured to output a decision signal based on the phase difference; and
a digital signal processing (DSP) circuit configured to generate a digital signal representative of the analog input electrical signal based on the decision signal.

19. The photonic monobit analog-to-digital converter of claim 18, further comprising:
a laser light source configured to generate the input optical signal.

20. The photonic monobit analog-to-digital converter of claim 18, further comprising:
a tunable delay circuit configured to delay the second coupled signal to generate the delayed version of the second coupled signal.

* * * * *

UNITED STATES PATENT AND TRADEMARK OFFICE
CERTIFICATE OF CORRECTION

PATENT NO. : 10,727,862 B1  
APPLICATION NO. : 16/359229  
DATED : July 28, 2020  
INVENTOR(S) : Shamee et al.

Page 1 of 1

It is certified that error appears in the above-identified patent and that said Letters Patent is hereby corrected as shown below:

In the Specification

In Column 1, Lines 40-41, delete "functional" and insert --functionalities-- therefor In Column 2, Line 41, delete "(HT)" and insert --(FFT)-- therefor In Column 3, Line 19, delete "12.5" and insert --125-- therefor In Column 4, Line 9, delete "BPI)" and insert --BPD-- therefor In Column 4, Line 45, delete "BPI)" and insert --BPD-- therefor In Column 5, Line 16, delete "e.g.," and insert --(e.g.,-- therefor In Column 5, Line 44, delete "BPI)/limiter" and insert --BPD/limiter-- therefor In Column 5, Line 51, after "implement", insert --Σ-Δ--

In Column 6, Line 24, delete "Detailed." and insert --Detailed-- therefor

Signed and Sealed this  
Nineteenth Day of January, 2021

Andrei Iancu  
*Director of the United States Patent and Trademark Office*